United States Patent
Liu

(10) Patent No.: US 10,581,460 B2
(45) Date of Patent: Mar. 3, 2020

(54) QC-LDPC DECODER, METHOD FOR PERFORMING LAYERED DECODING AND STORAGE DEVICE

(71) Applicant: SMARTECH WORLDWIDE LIMITED, Tortola (VG)

(72) Inventor: Yidi Liu, Hong Kong (CN)

(73) Assignee: SMARTECH WORLDWIDE LIMITED, Tortola (VG)

( * ) Notice: Subject to any disclaimer, the term of this patent is extended or adjusted under 35 U.S.C. 154(b) by 1 day.

(21) Appl. No.: 16/118,482

(22) Filed: Aug. 31, 2018

(65) Prior Publication Data

US 2020/0014402 A1    Jan. 9, 2020

(30) Foreign Application Priority Data

Jul. 9, 2018    (CN) .......................... 2018 1 0744039

(51) Int. Cl.
*H03M 13/11*    (2006.01)
*H03M 13/00*    (2006.01)
*G06F 11/10*    (2006.01)
*G06F 11/00*    (2006.01)

(52) U.S. Cl.
CPC ....... *H03M 13/116* (2013.01); *G06F 11/1076* (2013.01); *H03M 13/616* (2013.01)

(58) Field of Classification Search
None
See application file for complete search history.

(56) References Cited

U.S. PATENT DOCUMENTS

| | | | |
|---|---|---|---|
| 2009/0063930 A1* | 3/2009 | Matsumoto ........ | H03M 13/1102 714/752 |
| 2013/0173981 A1* | 7/2013 | Ueng ................. | H03M 13/1111 714/752 |
| 2014/0215287 A1* | 7/2014 | Murakami ........... | H03M 13/116 714/752 |
| 2016/0336964 A1* | 11/2016 | Khalil .................. | H03M 13/114 |
| 2019/0074850 A1* | 3/2019 | Hsiao .................. | H03M 13/116 |
| 2019/0181884 A1* | 6/2019 | Sun ...................... | H03M 13/116 |

* cited by examiner

Primary Examiner — Justin R Knapp

(57) ABSTRACT

A QC-LDPC decoder includes: a zero matrix monitoring circuit, configured to monitor whether a submatrix of a check matrix of QC-LDPC coding information is a zero matrix; a check node processing circuit, configured to calculate check message of the check node by using the check matrix according to variable message of a variable node if the submatrix is not a zero matrix; a variable node processing circuit, configured to update the variable message of the variable node according to the check message returned by the check node if the submatrix is not a zero matrix; and a check circuit, configured to determine whether the variable message satisfies a check standard or not.

15 Claims, 5 Drawing Sheets

QC-LDPC DECODER, METHOD FOR PERFORMING LAYERED DECODING AND STORAGE DEVICE

CROSS-REFERENCE TO RELATED APPLICATIONS

The present disclosure claims priority to Chinese Patent Application No. 201810744039.2, filed with the Chinese Patent Office on Jul. 9, 2018, titled "QC-LDPC DECODER, METHOD FOR PERFORMING LAYERED DECODING, STORAGE DEVICE AND COMMUNICATION MODULE", the entire contents of which are incorporated herein by reference.

TECHNICAL FIELD

The present disclosure relates to the technical field of LDPC coding, and in particular, relates to a QC-LDPC decoder, a method for performing layered decoding, a storage device and a communication module.

BACKGROUND

A low-density parity-check (LDPC) is a forward error correction code. By virtue of iterative decoding, coding is performed by using a pre-constructed spare check matrix. The LDPC code is excellent in terms of performance. However, since the conventional coding and decoding implementation method is very complicated, and is hard to be practiced on a hardware circuit, the LDPC code is restricted in application thereof.

To overcome the barrier of application of the LDPC code, Marc PC Fossorier proposes a quasi-cyclic low-density parity-check (QC-LDPC) code. The QC-LDPC code integrates the structural and random features, and greatly simplifies decoding circuitry while achieving the excellent performance of the LDPC code.

The QC-LDPC code simplifies the decoding circuitry. However, in the practical application scenario (for example, the QC-LDPC code has a great length), a QC-LDPC decoder still faces the difficulties of large occupation area of the chip, great demand on storage amount, complicated internal connection and high power consumption. Therefore, how to make a compromise between the decoding efficiency and resource consumption of the decoder, and how to better improve the data throughput of the decoder are still problems to be urgently solved.

SUMMARY

An embodiment of the present disclosure provides a QC-LDPC decoder. The QC-LDPC decoder includes: a zero matrix monitoring circuit, configured to monitor whether a submatrix of a check matrix of QC-LDPC coding information is a zero matrix; a check node processing circuit, configured to calculate check message of the check node by using the check matrix according to variable message of a variable node if the submatrix is not a zero matrix; a variable node processing circuit, configured to update the variable message of the variable node according to the check message returned by the check node if the submatrix is not a zero matrix; and a check circuit, configured to determine the variable message as decoded information if the variable message satisfies a check standard, and determine that decoding fails if the number of updates of the variable message exceeds a predetermined threshold but the check standard is still not satisfied.

An embodiment of the present disclosure provides a method for performing QC-LDPC layered decoding. The method includes: dividing a check matrix of QC-LDPC coded message into M layers, M being a positive integer; and decoding an $m+1^{th}$ layer according to variable message of decoding of an $m^{th}$ layer, wherein the decoding an $m+1^{th}$ layer according to variable message of decoding of an $m^{th}$ layer includes: detecting whether a current submatrix for decoding is a zero matrix; performing horizontal phase processing for variable message of a variable node if the current submatrix for decoding is not a zero matrix; skipping over the horizontal phase processing if the submatrix for decoding is a zero matrix; detecting whether the current submatrix for decoding is a zero matrix upon the horizontal phase processing; performing vertical phase processing according to a processing result of the horizontal phase processing to acquire the variable message if the current submatrix for decoding is not a zero matrix; skipping over the vertical phase processing if the submatrix for decoding is a zero matrix; judging whether the variable message satisfies a check standard upon the vertical phase processing; determining the variable information as a decoded result if the variable message satisfies the check standard; and determining that decoded fails if the number of updates of the variable message of the variable code exceeds a predetermined threshold.

An embodiment of the present disclosure provides a storage device. The storage device includes at least one QC-LDPC decoder. The QC-LDPC decoder includes a zero matrix monitoring circuit, configured to monitor whether a submatrix of a check matrix of QC-LDPC coding information is a zero matrix; a check node processing circuit, configured to calculate check message of the check node by using the check matrix according to variable message of a variable node if the submatrix is not a zero matrix; a variable node processing circuit, configured to update the variable message of the variable node according to the check message returned by the check node if the submatrix is not a zero matrix; and a check circuit, configured to determine the variable message as decoded information if the variable message satisfies a check standard, and determine that decoding fails if the number of updates of the variable message exceeds a predetermined threshold but the check standard is still not satisfied.

BRIEF DESCRIPTION OF THE DRAWINGS

One or more embodiments are illustrated by way of example, and not by limitation, in the figures of the accompanying drawings, wherein components having the same reference numeral designations represent like components throughout. The drawings are not to scale, unless otherwise disclosed.

DETAILED DESCRIPTION

In order to make the objectives, technical solutions, and advantages of the present disclosure clearer, the present disclosure is further described in detail below by reference to the embodiments and the accompanying drawings. It should be understood that the specific embodiments described herein are only intended to explain the present disclosure instead of limiting the present disclosure.

Figure 1:
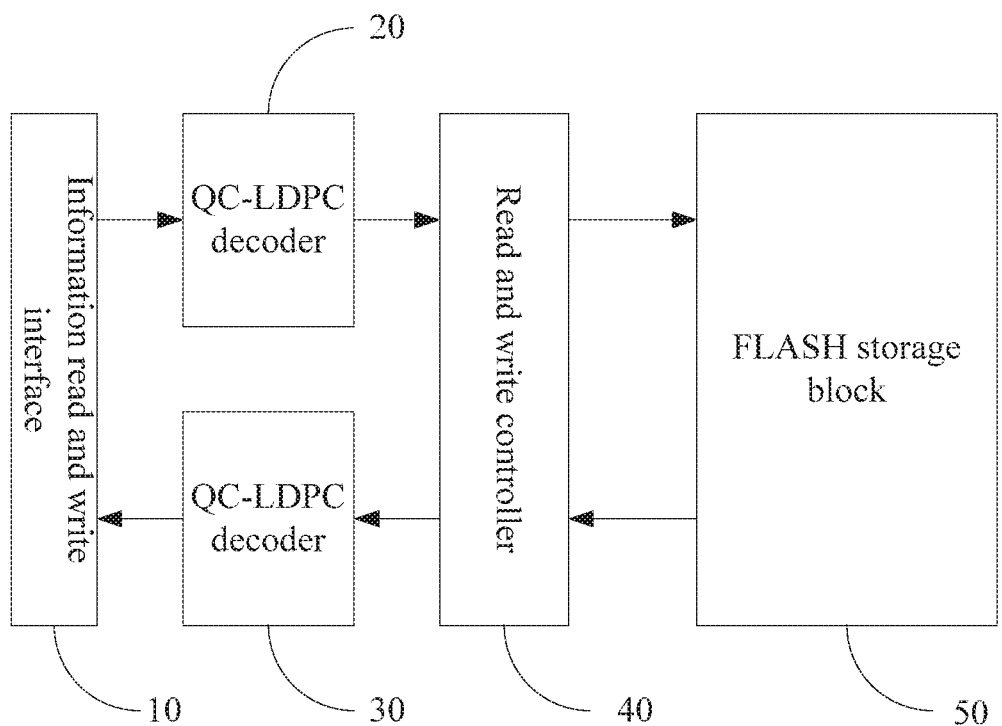
FIG. 1 is a schematic diagram of an application environment of a QC-LDPC code according to an embodiment of the present disclosure.

An LDPC code is an error correction code having an excellent performance which theoretically approaches the Shannon limit. The LDPC code may be applied in various information transmission scenarios, for example, channel coding of a wireless radio frequency channel or storage channel coding of a storage device, to improve reliability of information transmission. However, the QC-LDPC code is one type of LDPC codes, which has the cyclic feature, and may effectively reduce the difficulty in practicing the hardware circuit and thus is being widely applied. FIG. 1 is a schematic diagram of application of a QC-LDPC code in a storage device (for example, a solid hard disk) according to an embodiment of the present disclosure. The storage device is composed of a storage controller configured to control data read and write and decoding, and a storage unit configured to store data. As illustrated in FIG. 1, the storage controller includes: an information read/write interface 10, a QC-LDPC coder 20, a QC-LDPC decoder 30 and a read/write controller 40. The storage unit is formed of one or a plurality of FLASH storage blocks 50.

The information read/write interface 10 is a data interface configured to write or output data streams. Specifically, a corresponding interface form (for example, a USB interface) may be defined according to the actual needs.

The QC-LDPC coder 20 is composed of a corresponding hardware circuit, and is configured to perform QC-LDPC coding for input message according to a predetermined generation matrix and a corresponding coding algorithm. The QC-LDPC decoder 30 may also be composed of a corresponding hardware circuit, and may be configured to perform QC-LDPC decoding for input coded message according to a predetermined decoding algorithm and a check matrix.

The read/write controller 40 is connected to a FLASH storage block 50, and is used as a control hub and configured to control the data to be input to the corresponding FLASH storage block 50 or read from a specific location of the FLASH storage block 50 according to a control instruction.

An actual use process of the storage device may include the following two aspects:

During data writing, the data streams are input via the information read/write interface 10 to the QC-LDPC coder 20, and the QC-LDPC coder 20 performs QC-LDPC coding for the data and then output the coded data to the read/write controller 40. The read/write controller 40 sequentially stores the coded data in the corresponding storage address of the FLASH storage block 50 according to the control instruction.

During data reading, the read and write controller 40 reads the coded data from the corresponding storage address of the FLASH storage block 50 according to the control instruction, and provides the coded data to the QC-LDPC decoder 30. The QC-LDPC decoder 30 performs QC-LDPC decoding and outputs the decoded information to via the information read/write interface 10.

Through the above QC-LDPC coding and decoding processes, a storage channel is coded, which may effectively improve reliability of the storage device, and overcome the defect in storage reliability of a memory (for example, an SSD) based on the FLASH technology.

Similarly, a QC-LDPC coder and a QC-LDPC decoder may be respectively arranged between communication modules between which a wireless communication channel is established, which respectively perform QC-LDPC coding for sent message and perform QC-LDPC decoding for received message to implement effective message transfer between a receiving party and a sending party, and to reduce various external interference during the transmission.

As shown from the above application scenario, when QC-LDPC coding is applied, the QC-LDPC coder and the QC-LDPC decoder always desire a great data throughput or a low hardware circuit cost. Hereinafter, with reference to the features of the LDPC code, a decoder architecture which is capable of remarkably improving the data throughput of the QC-LDPC decoder with less hardware circuit cost.

In a check matrix H of the LDPC code, each row represents a check node of the LDPC code, and each column represents a variable node of the LDPC code. For example, in the following check matrix H:

$$H = \begin{array}{c} v_1 \ v_2 \ v_3 \ v_4 \ v_5 \ v_6 \ v_7 \\ \begin{bmatrix} 1 & 1 & 0 & 1 & 0 & 1 & 0 \\ 0 & 1 & 1 & 0 & 1 & 0 & 1 \\ 1 & 1 & 1 & 1 & 0 & 1 & 0 \\ 0 & 0 & 0 & 0 & 1 & 1 & 1 \end{bmatrix} \begin{array}{c} c_1 \\ c_2 \\ c_3 \\ c_4 \end{array} \end{array}$$

"0" indicates that no connection (between v3 and c1) is established between the corresponding check node and variable node, and "1" indicates that a connection (between v1 and c1) is established between the corresponding check node and variable node.

Figure 2:
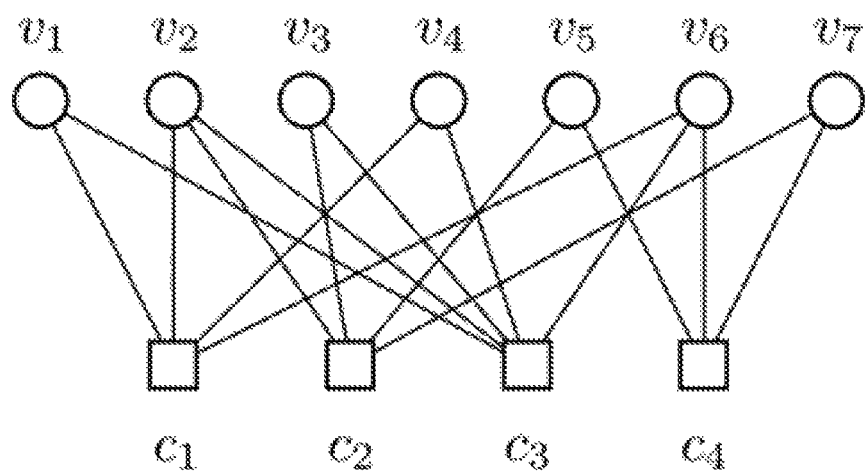
FIG. 2 is a Tanner diagram of the QC-LDPC code.

In addition, the LDPC code may also be represented by using a bidirectional graph model of a Tanner graph. As illustrated in FIG. 2, the Tanner graph includes two categories of nodes, check nodes and variable nodes. There are four check nodes, which correspond to the rows of the check matrix H. There are seven variable nodes, which correspond to the columns of the check matrix H. The number of connection lines between the variable nodes and the check nodes is the same as the number of "1" in the check matrix H.

QC-LPDC code is a structural LPDC code for ease of practice of circuitry. The QC-LDPC code has the structural feature. A check matrix $H_{qc}$ may be substantially divided into a plurality of submatrices $A_{i,j}$. Each submatrix is a full-zero matrix or a specific unit matrix (for example, a cyclic matrix formed by cyclic shift of the unit matrix) and has the feature of block circulation.

Assume that the submatrix $A_{i,j}$ is a z×z matrix, then with respect to 1≤i≤m and 1≤j≤n, the check matrix $H_{qc}$ of the QC-LDPC code may be represented by:

$$H_{qc} = \begin{bmatrix} A_{1,1} & A_{1,2} & \cdots & A_{1,n} \\ A_{2,1} & A_{2,2} & \cdots & A_{2,n} \\ \vdots & \vdots & \ddots & \vdots \\ A_{m,1} & A_{m,1} & \cdots & A_{m,n} \end{bmatrix}$$

With respect to the check matrix (using the above check matrix $H_{qc}$ as an example) of the QC-LDPC code, the matrix may be divided into a plurality of layers based on the rows of the submatrices visually. Based on such feature of the check matrix, during decoding of the QC-LDPC code, a very efficient decoding manner which is referred to as "layered decoding algorithm" may be used to implement highly efficient QC-LDPC decoding.

Figures 3, 4:
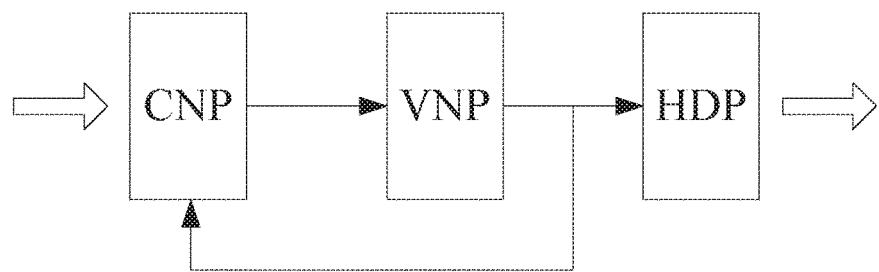
FIG. 3 is a schematic structural diagram of a typical QC-LDPC decoder.
FIG. 4 is a schematic diagram of a working time sequence of the QC-LDPC decoder in FIG. 3.

FIG. 3 is a schematic structural diagram of a QC-LDPC decoder designed based on the layered coding algorithm. The thought of the layered decoding algorithm is dividing the decoding process into M iteration processes by the way of layering a complete decoding process based on the check matrix. Upon completion of the last iteration process, final decoded message is output (each iteration process corresponds to a layer of each check matrix). Each iteration process is based on an output result of a previous iteration process.

During each iteration process (that is, decoding of an $m^{th}$ layer), horizontal phase processing and vertical phase processing are both need to be performed. In addition, upon completion of each iteration process, the obtained decoded result (that is the variable information on the variable node) is checked to determine whether the decoded result satisfies a check standard.

The horizontal phase processing refers to transferring variable message from each variable node to each check node corresponding to the variable node, and calculating check message corresponding to each check node. The vertical phase processing refers to returning the check message from the check node to each variable node corresponding to the check node, and calculating variable message of the variable node.

In the QC-LDPC decoder as illustrated in FIG. 4, a check node processing circuit CNP represents a hardware circuit configured to perform horizontal phase processing, and a variable node processing circuit VNP represents a hardware circuit configured to perform vertical phase processing. A check circuit HDP represents a hardware circuit configured to perform the check steps to judge whether the variable information on the variable node satisfies the check standard.

As illustrated in FIG. 4, the check node processing circuit CNP, the variable node processing circuit VNP and the check circuit HDP are sequentially connected. The variable information output by the variable node processing circuit VNP is sent to the check node processing circuit CNP for decoding of a next layer, and to the check circuit HDP for further checking respectively.

In this embodiment, the check circuit HDP may employ a hardware-based judgment mode to check a decoding result (that is, the variable information) of the $m^{th}$ layer.

Figure 5:
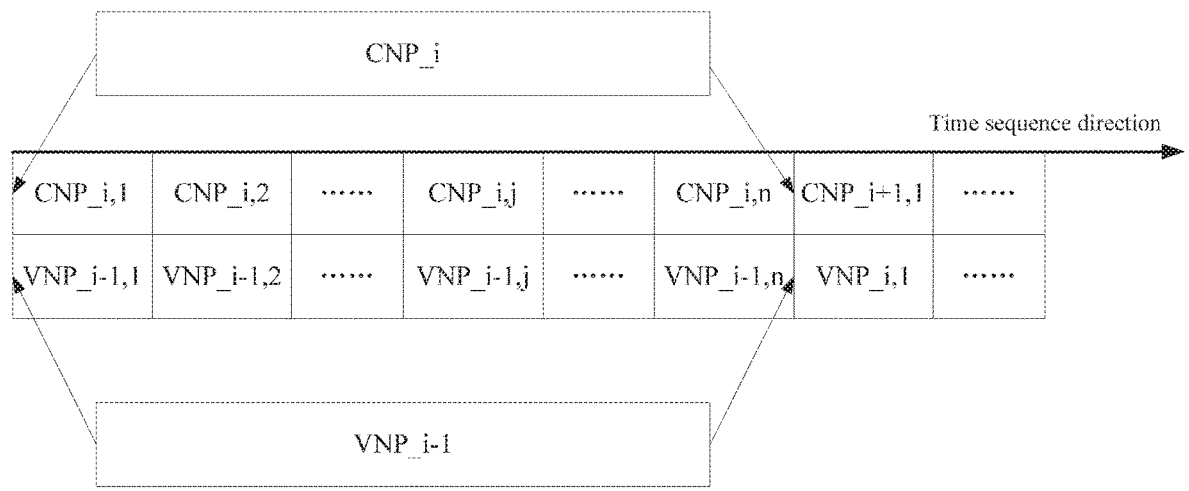
FIG. 5 is a schematic diagram of a working time sequence for performing CNP_i and VNP_i−1 in FIG. 4.

FIG. 5 is a schematic diagram of a working time sequence of the QC-LDPC decoder in FIG. 4. Assume that the check matrix is divided into M layers, then as illustrated in FIG. 5, the QC-LDPC decoder has the following working sequence:

1. The variable node processing circuit VNP and the check node processing circuit CNP be pipelined to some extent. The check node processing circuit CNP performs the horizontal phase processing based on the variable information of the current variable node, and then sends processed data to the variable node processing circuit VNP.

2. In the same time, based on the variable message output by the variable node processing circuit VNP, the check node processing circuit CNP performs horizontal phase processing for a next layer. The check circuit HDP performs checking based on the variable message output by the current variable node processing circuit VNP.

In the embodiment as illustrated in FIG. 4, CNP_i and NP_i respectively represent horizontal phase processing and vertical phase processing for an $i^{th}$ layer, wherein i is a positive integer between 1 and m.

Even if the above disclosed "layered decoding algorithm" may reduce the processing time needed by the LDPC decoder by parallelly performing each iteration process. However, considering the scenario where a LDPC message having a very great length is used (for example, 4 kb or 2 kb), the resources or circuit area for parallelly performing the iteration processes are large (the check nodes in a quantity the same as the quantity of rows of each submatrix and the variable nodes in a quantity the same as the quantity of columns of the check matrix need to be used).

Therefore, to further obtain a compromise between the decoding efficiency and the circuit resources and to yield a practical application capability, each iteration process may be further divided into n segments, and the decoder performs decoding of a layer based on n timeslots. As such, the circuit area may be effectively reduced by decreasing the number of variable nodes needed by the QC-LDPC decoder, such that the QC-LDPC decoder is simple to practice.

Assume that the number of rows and the number of columns in a submatrix are both z. Correspondingly, the number of columns in the check matrix formed by the submatrices is N=z×n.

If the circuit area needed for directly performing an iteration process is N×z. The iteration process is divided into a plurality of segments, and one iteration process is performed by using n timeslots. In this way, the area of the decoder needed is reduced to z×z.

FIG. 5 is a schematic diagram of a working sequence in decoding of the $i^{th}$ layer. As illustrated in FIG. 5, the decoding task to be performed in the decoding of the $i^{th}$ layer is performed in the n timeslots. The QC-LDPC decoder performs the decoding of the $i^{th}$ layer by using the n timeslots. CNP_i,j and VNP_i,j respectively represent horizontal phase processing and vertical phase processing for a $j^{th}$ segment in the $i^{th}$ layer, wherein i is a positive integer between 1 and M, and j is a positive integer between 1 and n.

As shown in FIG. 4 and FIG. 5, with respect to a specific check matrix, if more segments are obtained by dividing each layer (that is, the n is greater), the circuit area occupied by the QC-LDPC decoder is smaller (the number of variable nodes needed is reduced), and more timeslots are needed for performing the decoding task of each layer. In other words, the smaller the number of segments, the shorter the decoding time of the LDPC decoder, and the higher the circuit cost. On the contrary, the greater the number of segments, the longer the decoding time of the LDPC decoder, and the lower the circuit cost.

Generally, based on the check matrix of the QC-LDPC code, each layer may be divided into segments that are in a size the same as the submatrix, and the submatrices are used as the processing units to yield a balance between the circuit cost and the decoding time.

That is, the number of check nodes included in the check node processing circuit is the same as the number of rows of the submatrix, and the number of variable nodes included in the variable node processing circuit is the same as the number of columns of the submatrix, such that a small circuit area is practiced.

The property of the LDPC code determines that the check matrix thereof is a spare matrix. Therefore, in the check matrix of the QC-LDPC code, it is always commonplace that submatrices $A_{i,j}$ in a proportion are zero matrices (no connection line is presented between the corresponding check node and variable node, and information transfer is not present between the nodes). However, the variable node processing circuit CNP and the check node processing circuit VNP substantially do not need to process these zero matrices. Therefore, in the working sequence of the typical QC-LDPC decoder as illustrated in FIG. 5, many processing timeslots are wasted (the timeslots for processing the zero matrices).

To further improve the data throughput of the QC-LDPC decoder and reduce the time for decoding. An embodiment of the present disclosure provides a QC-LDPC decoder structure as illustrated in FIG. 6, which is to prevent waste of the timeslots caused by processing the zero matrices.

Figure 6:
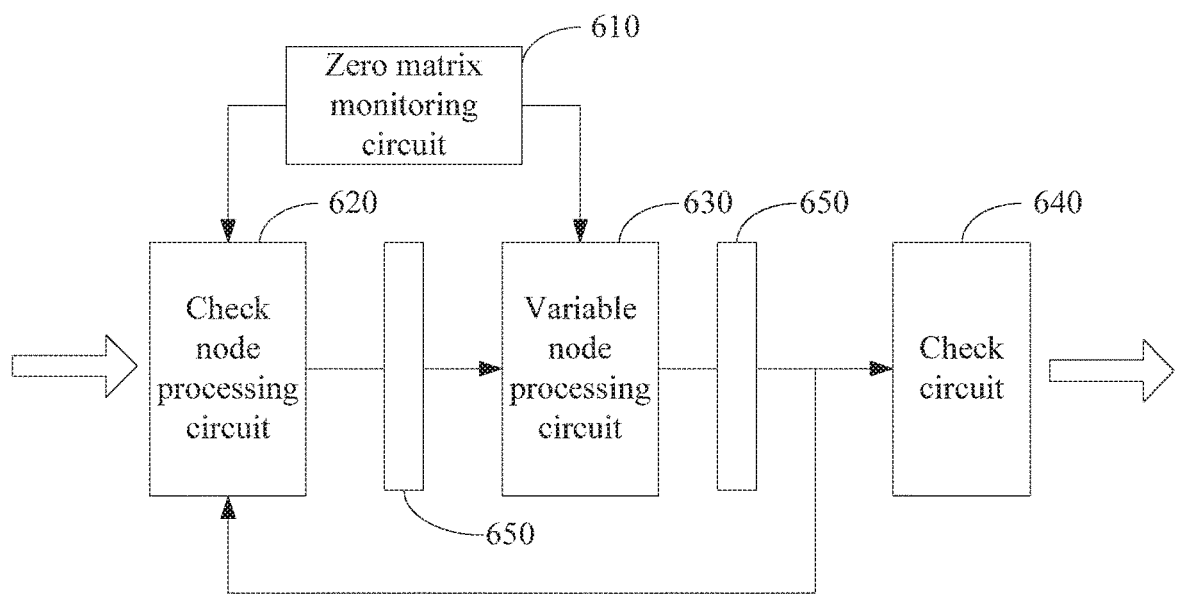
FIG. 6 is a schematic structural diagram of a QC-LDPC decoder according to an embodiment of the present disclosure.

As illustrated in FIG. 6, the QC-LDPC decoder may include: a zero matrix monitoring circuit 610, a check node processing circuit 620, a variable node processing circuit 630 and a check circuit 640.

During decoding of each layer to which LDPC coded message is input, the zero matrix monitoring circuit 610 is configured to monitor whether a submatrix to be currently decoded is a zero matrix prior to performing horizontal phase processing or vertical phase processing. If the submatrix is a zero matrix, no data is transferred currently, and the horizontal phase processing or the vertical phase processing does not need to be performed for the coded message. The check node processing circuit 620 or the variable node processing circuit 630 can be skipped over.

Otherwise, the check message of the check node is calculated by the check node processing circuit 620 by using the check matrix according to the variable message of the variable node, or the variable message of the variable node may be updated by the variable node processing circuit 630 according to the check message returned by the check node.

In some embodiments, a log likelihood ratio (LLR) may be used to represent the variable message, for ease of calculation of the check message and the variable message. Nevertheless, other suitable manners, in addition to the LLR value, may also be used to represent the variable message.

After the variable message of all the variable nodes in each layer is updated, the check circuit is configured to judge whether the variable message satisfies a check standard. If the variable message satisfies the check standard, the check circuit 640 may determine that the decoding is successful, and provide or output corresponding decoded message. If the variable message does not satisfy the check standard, the variable message may be iteratively updated, and then sent to the check circuit 640 for judgment.

Nevertheless, even through multiple times of iterations, it may not be definitely ensured that the variable message satisfies the check standard. Therefore, when the number of updates of the variable message exceeds a predetermined threshold, it may be directly determined that the decoding fails if the check circuit 640 judges that the variable message still does not satisfy the check standard.

In addition, the variable message skipping over the processing by the check node processing circuit 620 and/or the variable node processing circuit 630 also needs to be provided to the check circuit 640 for check. That is, the check circuit 640 needs to check all the coded message.

It should be noted that in the embodiment of the present disclosure, the hardware circuits in the QC-LDPC decoder are only described and named based on their function (for example, the zero matrix monitoring circuit 610, the check node processing not 620, the variable node processing circuit 630 and the check circuit 640). A person skilled in the art may select, adjust or combine the commonly used circuit structures in the art to practice circuit structures for implementing one or a plurality of functions according to the functions to be implemented by the hardware circuits disclosed in the embodiment of the present disclosure. The practical circuit structures for implementing these functions are all well known by a person skilled in the art, and are not intended to limit the present disclosure.

As illustrated in FIG. 4, to improve the efficiency, the variable node processing circuit 630 and the check circuit 640 have the same execution time. The two circuits are in parallel and correspond to each other. However, in the embodiment as illustrated in FIG. 6, the zero matrix monitoring circuit configured to detect the zero matrix is additionally configured. Therefore, the variable node processing circuit 630 only needs to perform the vertical phase processing for a portion of the coding information, and in this case, the check circuit 640 still needs to check all the coding information, which is a conflict.

Under this conflict, the variable node processing circuit 630 may not one-to-one correspond to or match with the check circuit 640, and thus the operation time is different.

In some embodiments, to prevent such conflict and ensure parallel execution of the variable node processing circuit 630 and the check circuit 640, the variable node processing circuit 630 needs to be arranged to mate with the check circuit 640 to ensure that the check circuit 640 may check the variable information in the n timeslots provided by the variable node processing circuit, to complete decoding of $m^{th}$ layer.

Specifically, multiple different mating arrangement manners may be employed to solve the problem that the two circuits may not mate with each other. For example, more check circuits 640 may be arranged, such that the number of check circuits 640 is greater than the number of variable node processing circuits 630. In this way, idle check circuits 640 may be provided to ensure that the variable message skipping over the zero matrix is also checked and judged in the same timeslots.

In some other embodiments, one check circuit 640 may also be used to check the variable message (for example, each check circuit 640 checks two layers of VNP_i and VNP_i+1) of at least two layers output by two or more than two variable node processing circuits.

Further, as illustrated in FIG. 5, the check node processing circuit 620 and the variable node processing circuit 630 are pipeline. The data (VNP_i−1,j) output by the check node processing circuit 620 is the input data of the variable node processing circuit 630, and the variable node processing circuit 630 may calculate CNP_i,j after obtaining the input data.

As illustrated in FIG. 5, the process of sequentially executing each segment ensures that the input data desired by the variable node processing circuit 630 may be generated in the previous timeslot, and no data conflict is caused. However, in the embodiment as illustrated in FIG. 6, when a submatrix corresponding to a segment is a zero matrix, the check node processing circuit 620 and the variable node processing circuit 630 may be skipped over and may not be processed. Therefore, such skipping over may cause a data conflict between the check node processing circuit 620 and the variable node processing circuit 630 (that is, the desired input data of the VNP circuit 630 is not generated).

In some embodiments, the problem of data conflict may be prevented by staggering the execution time of the check node processing circuit 620 from the execution time of the variable node processing circuit 630.

For example, as illustrated in FIG. 6, a delay circuit 650 having a suitable delay time length may be arranged in a data transmission loop of the check node processing circuit 620 and the variable node processing circuit 630, such that a suitable delay is generated between calculation of CNP_i,j by the variable node processing circuit 630 and outputting of VNP_i−1,j by the check node processing circuit 620, thereby preventing the problem of data conflict.

Figure 7:
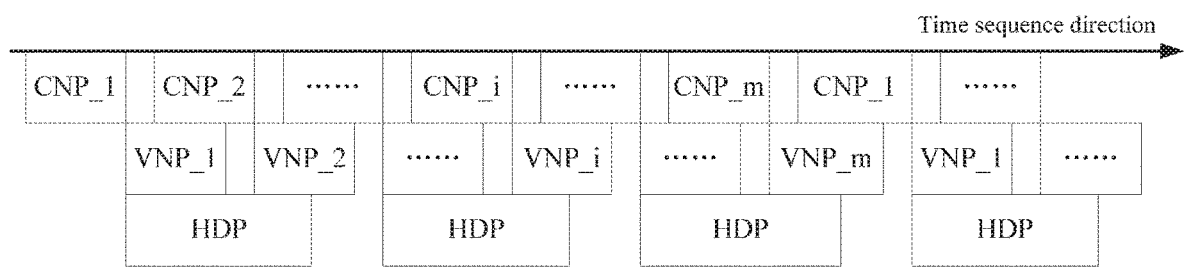
FIG. 7 is a schematic diagram of a working time sequence of the QC-LDPC decoder in FIG. 6.

FIG. 7 is a schematic diagram of a working time sequence of a QC-LDPC decoder according to an embodiment of the present disclosure. As illustrated in FIG. 7, the working sequence is specifically as follows:

1. The check node processing circuit 620 performs coding for the first layer based on the input coding information, and outputs CNP_1 as the input data of the variable node processing circuit 630.

2. The check node processing circuit 620 and the variable node processing circuit 630 alternately and sequentially perform decoding for different layers. When the variable node processing circuit 630 performs horizontal phase processing for the $i^{th}$ layer, the check node processing circuit 620 is delayed for a predetermined time t and then performs vertical phase processing for the $i+1^{th}$ layer.

3. Each check circuit 640 corresponds to two variable node processing circuits 630, and is configured to perform checking for the $i^{th}$ layer and the $i+1^{th}$ layer to judge whether the decoding is successfully and output a corresponding result.

An embodiment of the present disclosure further provides a method for QC-LDPC layered decoding. In the method, a check matrix of the QC-LDPC coding information is firstly divided into M layers. Afterwards, iterative calculation is performed for each layer, to obtain a final decoding result.

Figure 8:
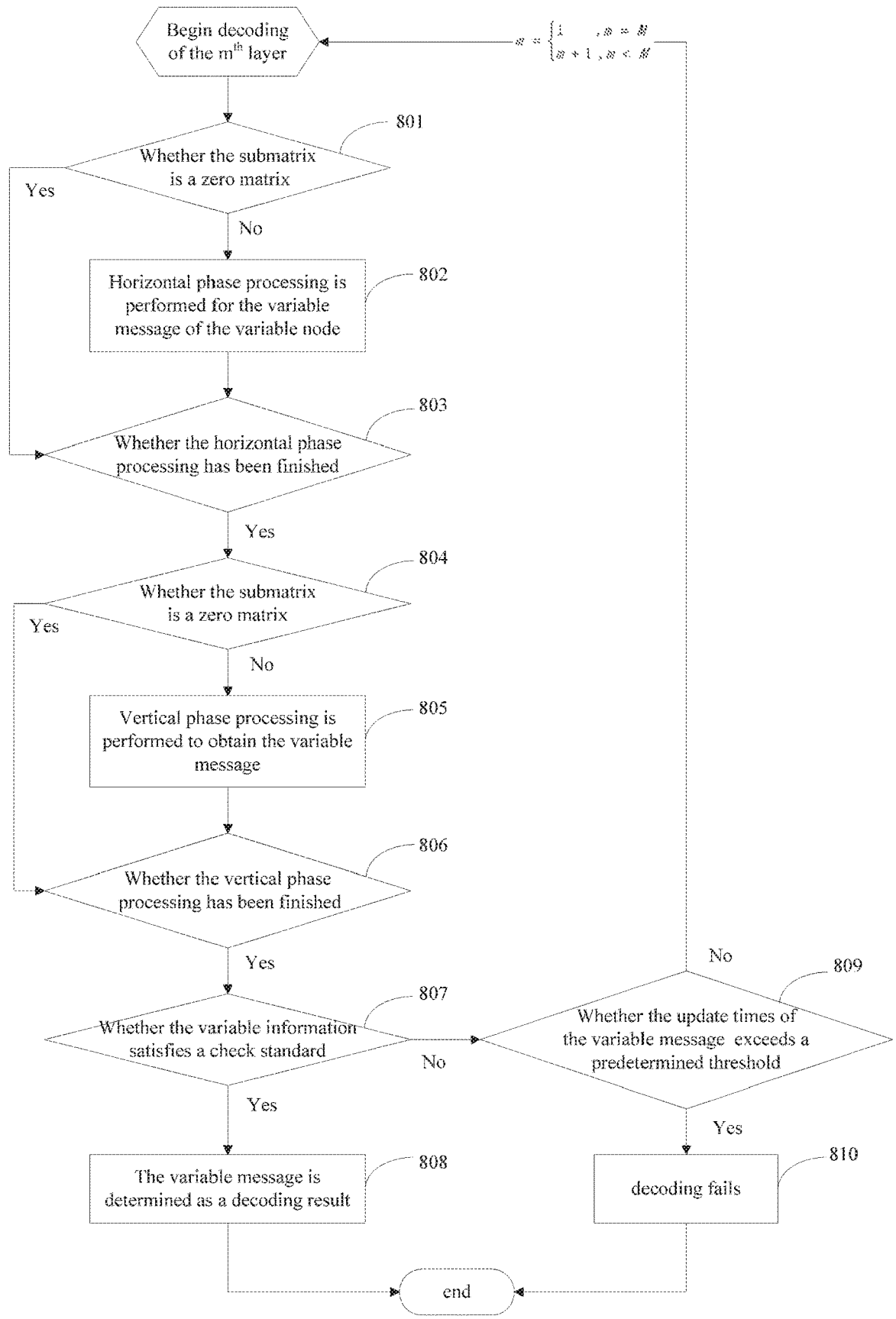
FIG. 8 is a flowchart of a method for performing QC-LDPC decoding according to an embodiment of the present disclosure.

FIG. 8 is a flowchart of a method for calculating a decoding result of an $m^{th}$ layer according to an embodiment of the present disclosure. In this embodiment, the unit for performing the decoding operation is the submatrix of the check matrix (which may be practiced by further dividing each layer into a plurality of segments).

As illustrated in FIG. 8, the method includes the following steps:

801: Whether the submatrix is a zero matrix is detected. If the submatrix is not a zero matrix, step 802 is performed; and otherwise, step 802 is skipped over and step 803 is performed.

802: Horizontal phase processing is performed for the variable message of the variable node.

803: Whether the horizontal phase processing has been finished is judged. If the horizontal phase processing ends, step 804 is performed.

804: Whether the submatrix is a zero matrix is detected. If the submatrix is a zero matrix, step 805 is performed; and otherwise, step 805 is skipped over and step 806 is performed.

805: Vertical phase processing is performed according to an output result of the horizontal phase processing, to obtain the variable message.

806: Whether the vertical phase processing has been finished is judged. If the vertical phase processing ends, step 807 is performed.

807: Whether the variable information satisfies a check standard is judged. If the variable message satisfies the check standard, step 808 is performed; and otherwise, step 809 is performed.

808: The variable message is determined as a decoding result.

809: Whether the number of updates of the variable message of the variable node exceeds a predetermined threshold is judged. If the number of updates of the variable message of the variable node exceeds the predetermined threshold, the process returns to the horizontal phase processing and the vertical phase processing, and the variable message of the variable node is updated again; and otherwise, it is determined that the decoding fails (810). When the decoding fails or a decoding result is obtained, the decoding of the $m^{th}$ layer ends.

The decoding method as illustrated in FIG. 8 may be performed by the QC-LDPC decoder as illustrated in FIG. 6. The input LDPC coding information is decoded to obtain corresponding decoding information. As disclosed in the above embodiment, the method steps as illustrated in FIG. 8 may be either parallelly performed by a plurality of types of hardware circuit modules based on the actual needs and according to an execution logic requirement (for example, step 804 and step 803) or may be sequentially and alternately performed by different hardware circuits in pipeline (for example, step 802 and step 803).

For example, to prevent the data conflict, in response to vertical phase processing of the $m^{th}$ layer, delaying a predetermined time duration and then performing horizontal phase processing for the $m+1^{th}$ layer, M≥m≥1, wherein when m is equal to M, M+1 is equal to 1. In addition, whether the variation information satisfies the check standard is judged at an interval of variation information of decoding of two or more than two layers.

Assume that in the check matrix of the QC-LDPC code, the proportion that the submatrices in each layer are non-zero matrices is r_cw (that is, an average column weight of the check matrix of the QC-LDPC code). By using the above zero matrix detecting method, after the decoding for the zero matrix is skipped over, a saved processing time proportion is 1-r_cw.

The check matrix of the LDPC code has the feature of a spare matrix (that is, the value of r_cw is very small). Therefore, with the decoding method according to the embodiment of the present disclosure, a monitoring circuit and a delaying circuit which occupy less circuit resources or chip area are additionally configured, such that the processing time desired for decoding is remarkably reduced, and the throughput of the QC-LDPC decoder is effectively improved.

In addition, the decoding method according to the embodiment of the present disclosure may further assist establishment or construction of the check matrix. To establish a check matrix having good performance, generally submatrix block masking may be employed to convert the submatrices from non-zero matrices to zero matrices, such that short rings in the check matrix are eliminated and the circumference of the check matrix is increased.

Under a combination of the submatrix block masking and the decoding method according to the embodiment of the present disclosure, since increase of the zero matrices may also shorten the time for decoding, the decoding time for the LDPC code is shortened while the performance of the LDPC code is improved in the submatrix block masking.

Professional personnel should be further aware that with reference to the embodiments of the present application disclosed herein, various exemplary LDPC code decoding steps may be implemented in the form of electronic hardware, computer software or a combination thereof. To clearly describe interchangeability between the hardware and software, the above description has generally illustrates the compositions and steps of the various example according to the functions. Whether such functions are implemented in the form of software or hardware depends on the specific application and the design restrictions applied to the entire system.

Professional technical personnel may implement the described functions by using different methods for each specific application. However, such implementation shall not be deemed as going beyond the scope of the present disclosure. The computer software program may be stored in a computer readable storage medium, wherein the computer software program, when being executed, may perform the steps and processes according to the above method embodiments. The storage medium may be any medium capable of storing program codes, such as read-only memory (ROM), a random access memory (RAM), a magnetic disk, or a compact disc-read only memory (CD-ROM).

Described above are exemplary embodiments of the present disclosure, but are not intended to limit the scope of the present disclosure. Any equivalent structure or equivalent process variation made based on the specification and drawings of the present disclosure, which is directly or indirectly applied in other related technical fields, fall within the scope of the present disclosure.

What is claimed is:

1. A quasi-cyclic low-density parity-check (QC-LDPC) decoder, comprising:
    a zero matrix monitoring circuit, configured to monitor whether a submatrix of a check matrix of QC-LDPC coding information is a zero matrix;
    a check node processing circuit, configured to calculate check message of the check node by using the check matrix according to variable message of a variable node if the submatrix is not a zero matrix;
    a variable node processing circuit, configured to update the variable message of the variable node according to the check message returned by the check node if the submatrix is not a zero matrix; and
    a check circuit, configured to determine the variable message as decoded information if the variable message satisfies a check standard, and determine that decoding fails if number of updates of the variable message exceeds a predetermined threshold but the check standard is still not satisfied.

2. The QC-LDPC decoder according to claim 1, wherein the check matrix of the QC-LDPC coding information is divided into M layers, M being a positive integer; and
    the QC-LDPC decoder is configured to decode the QC-LDPC coding message from a first layer to an $M^{th}$ layer.

3. The QC-LDPC decoder according to claim 2, further comprising a delay circuit; wherein
    the delay circuit is arranged in a data transmission loop of the check node processing circuit and the variable node processing circuit, and is configured to form a delay between a moment for decoding an $m^{th}$ layer by the check node processing circuit and a moment for decoding an $m+1^{th}$ layer by the variable node processing circuit, $M \geq m \geq 1$, wherein when m is equal to M, M+1 is equal to 1.

4. The QC-LDPC decoder according to claim 2, wherein the check circuit is arranged to match with the variable node processing circuit.

5. The QC-LDPC decoder according to claim 4, wherein the check circuit that is arranged to match with the variable node processing circuit is configured to: check variable message output by the variable node processing circuit in response to decoding of at least two layers.

6. The QC-LDPC decoder according to claim 4, wherein the number of check circuits that are arranged to match with the variable node processing circuits is greater than the number of variable node processing circuits.

7. The QC-LDPC decoder according to claim 1, wherein the number of check nodes included in the check node processing circuit is the same as that of rows of the submatrix; and the number of variable nodes included in the variable node processing circuit is the same as that of columns of the submatrix.

8. The QC-LDPC decoder according to claim 1, wherein the check node processing circuit is configured to:
    transfer the variable message from each variable node to each check node connected to the variable node, and calculate the check message of the check node; and
    the variable node processing circuit is configured to:
    return the check message from the check node to each variable node connected to the check node, and calculate the variable message of the variable node; wherein the variable message is represented by a log likelihood ratio.

9. A method for performing quasi-cyclic low-density parity-check (QC-LDPC) layered decoding, comprising:
    dividing a check matrix of QC-LDPC coded message into M layers, M being a positive integer; and decoding an $m+1^{th}$ layer according to variable message of decoding of an $m^{th}$ layer, $M \geq m \geq 1$, wherein when m is equal to M, M+1 is equal to 1; wherein the decoding an $m+1^{th}$ layer according to variable message of decoding of an $m^{th}$ layer comprises:
    detecting whether a current submatrix for decoding is a zero matrix;
    performing horizontal phase processing for variable message of a variable node if the current submatrix for decoding is not a zero matrix;
    skipping over the horizontal phase processing if the submatrix for decoding is a zero matrix;
    detecting whether the current submatrix for decoding is a zero matrix upon the horizontal phase processing;
    performing vertical phase processing according to a processing result of the horizontal phase processing to acquire the variable message if the current submatrix for decoding is not a zero matrix;
    skipping over the vertical phase processing if the submatrix for decoding is a zero matrix;
    judging whether the variable message satisfies a check standard upon the vertical phase processing;
    determining the variable message as a decoded result if the variable message satisfies the check standard; and
    determining that decoded fails if number of updates of the variable message of the variable code exceeds a predetermined threshold.

10. The method according to claim 9, further comprising:
    delaying a predetermined time between a performing moment of the vertical phase processing of the $m^{th}$ layer and a performing moment of the horizontal phase processing for the m+1$^{th}$ layer; and judging, at an interval of variation information of decoding of two or more than two layers, whether the variation information satisfies a check standard.

11. A storage device, comprising a plurality of storage units and a storage controller; the storage controller comprises at least one quasi-cyclic low-density parity-check (QC-LDPC) decoder; wherein the QC-LDPC decoder comprises:

a zero matrix monitoring circuit, configured to monitor whether a submatrix of a check matrix of QC-LDPC coding information is a zero matrix;

a check node processing circuit, configured to calculate check message of the check node by using the check matrix according to variable message of a variable node if the submatrix is not a zero matrix;

a variable node processing circuit, configured to update the variable message of the variable node according to the check message returned by the check node if the submatrix is not a zero matrix; and a check circuit, configured to determine the variable message as decoded information if the variable message satisfies a check standard, and determine that decoding fails if number of updates of the variable message exceeds a predetermined threshold but the check standard is still not satisfied.

12. The storage device according to claim 11, wherein the check matrix of the QC-LDPC coding information is divided into M layers, M being a positive integer; and the QC-LDPC decoder is configured to decode the QC-LDPC coding message from a first layer to an M$^{th}$ layer.

13. The storage device according to claim 12, the QC-LDPC decoder further comprising a delay circuit;

wherein the delay circuit is arranged in a data transmission loop of the check node processing circuit and the variable node processing circuit, and is configured to form a delay between a moment for decoding an m$^{th}$ layer by the check node processing circuit and a moment for decoding an m+1$^{th}$ layer by the variable node processing circuit, M≥m≥1, wherein when m is equal to M, M+1 is equal to 1.

14. The storage device according to claim 12, wherein the number of check circuits is greater than the number of variable node processing circuits in order to arrange the check circuits to match with the variable node processing circuits.

15. The storage device according to claim 12, wherein the check circuit is configured to check variable message output by the variable node processing circuit in response to decoding of at least two layers in order to arranged to the check circuits to match with the variable node processing circuits.

* * * * *